United States Patent
Clark et al.

(10) Patent No.: US 7,480,189 B2
(45) Date of Patent: Jan. 20, 2009

(54) CROSS-COUPLED WRITE CIRCUIT

(75) Inventors: Lawrence T. Clark, Phoenix, AZ (US); Jay B. Miller, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/251,674

(22) Filed: Sep. 20, 2002

(65) Prior Publication Data
US 2004/0057279 A1   Mar. 25, 2004

(51) Int. Cl.
*G11C 7/10* (2006.01)
(52) U.S. Cl. ............................. 365/189.05; 365/189.03; 365/190; 365/202
(58) Field of Classification Search ............ 365/189.05, 365/189.03, 190, 202
See application file for complete search history.

(56) References Cited

U.S. PATENT DOCUMENTS

| | | | | |
|---|---|---|---|---|
| 5,615,160 A | * | 3/1997 | Phillips et al. | 365/203 |
| 5,831,924 A | * | 11/1998 | Nitta et al. | 365/230.03 |
| 6,091,629 A | * | 7/2000 | Osada et al. | 365/156 |
| 6,157,560 A | * | 12/2000 | Zheng | 365/63 |
| 6,442,060 B1 | * | 8/2002 | Leung et al. | 365/154 |
| 6,453,390 B1 | * | 9/2002 | Aoki et al. | 711/140 |
| 6,515,887 B2 | * | 2/2003 | Fujimoto | 365/63 |
| 6,859,392 B2 | * | 2/2005 | Abedifard et al. | 365/185.13 |
| 7,079,427 B2 | * | 7/2006 | Huang | 365/189.05 |

* cited by examiner

*Primary Examiner*—Viet Q. Nguyen
(74) *Attorney, Agent, or Firm*—Kacvinsky LLC

(57) ABSTRACT

A write circuit structure may be used to transfer data between global bit lines and local bit lines of a cache. The write circuit structure located between the hierarchical bit lines may be buffers in parallel with P-channel devices in one embodiment or cross-coupled P-channel and N-channel devices in another embodiment.

5 Claims, 3 Drawing Sheets

CROSS-COUPLED WRITE CIRCUIT

The architecture of microprocessors generally includes an internal memory cache, often called a Level 1 (L1) cache, that is a Static Random Access Memory (SRAM) that provides high-speed data accesses. Most personal computers also include a Level 2 (L2) cache that is usually much larger than the L1 cache and therefore has longer latency. The L1 and L2 caches sit between the central processing unit and an external lower-speed main memory, which may be a Dynamic Random Access Memory (DRAM), and disk memory.

The SRAM cache may include hierarchical bit line schemes that reduce the diffusion and metal wire capacitance that load memory cells during read and write operations. Complementary Metal Oxide Semiconductor (CMOS) pass-gates have been used to multiplex data between a global bit line that is connected to the sense amps and a local bit line that is connected to a group of SRAM memory cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
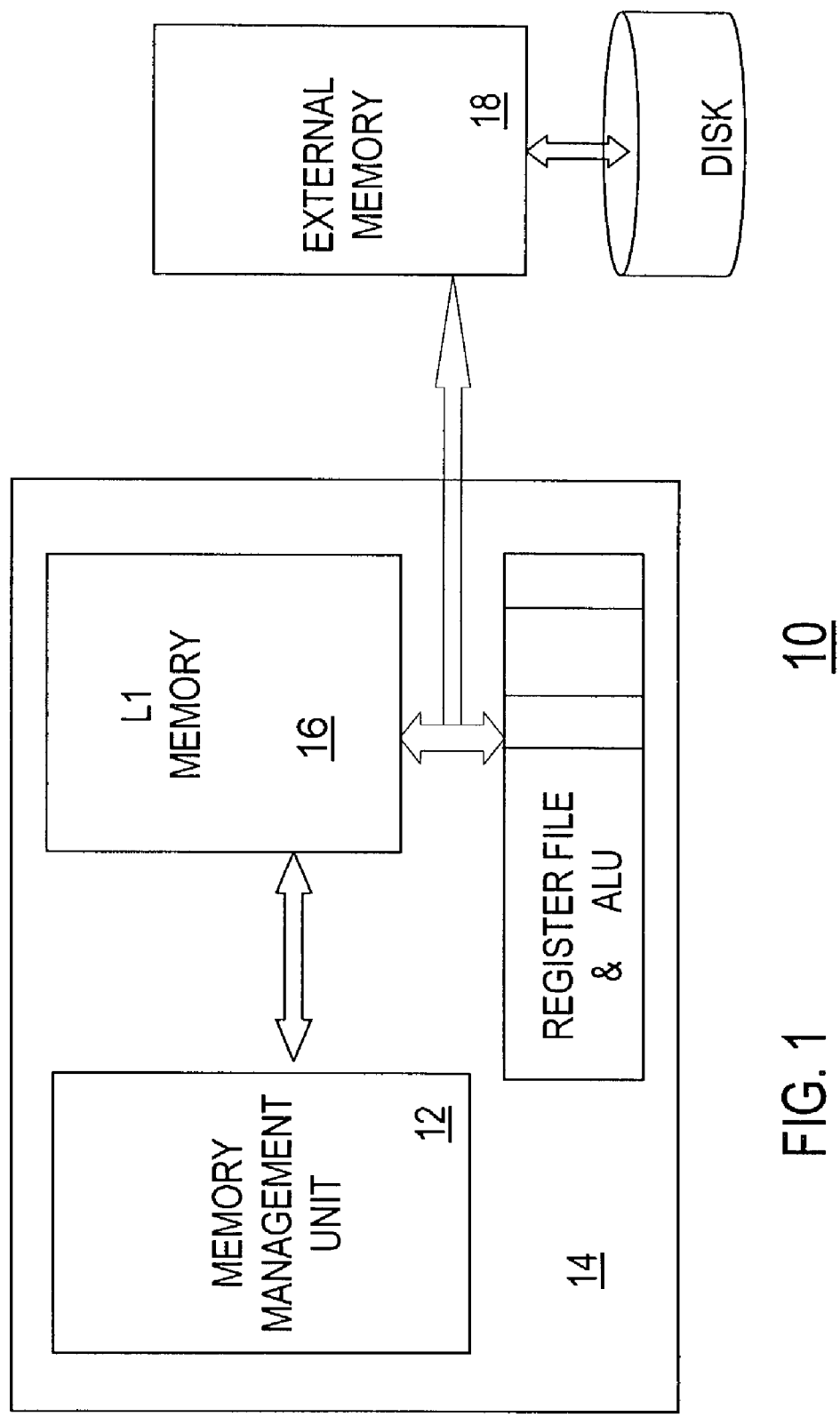
FIG. 1 illustrates a computer system having an internal memory and external memory in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the present invention may be used in a variety of applications. The circuits disclosed herein may be used in internal memories of microcontrollers, general-purpose microprocessors, Digital Signal Processors (DSPs), Reduced Instruction-Set Computing (RISC), or Complex Instruction-Set Computing (CISC). The present invention may also be incorporated into smart phones, communicators and Personal Digital Assistants (PDAs), base band and application processors, platform OS based devices, digital cameras, audio & video decoders, automotive infotainment, modems, set top boxes and a host of other electronic products. It should be understood that the scope of the present invention is not limited to these examples.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

FIG. 1 is a block diagram that illustrates a computer system 10 having an Operating System (OS) that may manage the limited physical memory present on the computer, dividing the physical memory among many processes that may be running simultaneously and allocating each process an appropriate memory share. The OS running on a core processor 14 may rely on hardware support from a Memory Management Unit (MMU) 12 to manage the memory and export functions that other subsystems and applications may use to interact with the memory. The data from logical operations performed in an Arithmetic Logic Unit (ALU) in core processor 14 may be stored internally in L1 memory 16 and externally in main memory 18.

Generally, L1 memory 16 may be high-speed Static Random Access Memory (SRAM) while main memory 18 may be a slower Dynamic Random Access Memory (DRAM), although the type of memory is not a limitation of the claimed subject matter. It should be noted that the claimed subject matter for the described embodiments is applicable to any SRAM, regardless of whether the memory is embedded on chip with a processor core or external as a stand-alone memory.

Figure 2:
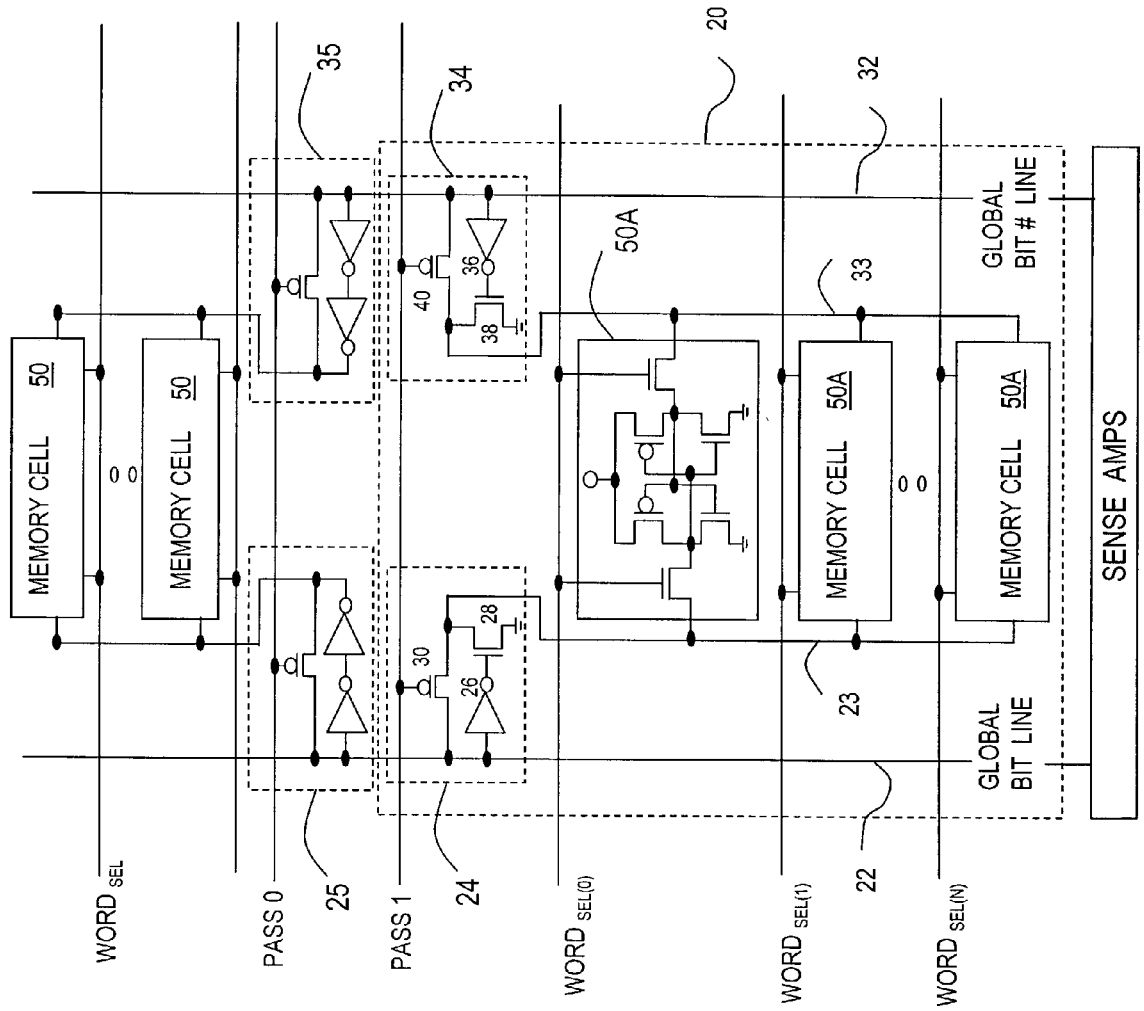
FIG. 2 is a diagram that illustrates an embodiment having buffers and pass transistors in a hierarchical bit line scheme for writing and reading the memory of FIG. 1.

FIG. 2 is a diagram that illustrates memory cells 50 and 50A arrayed in a column of L1 memory 16 (see FIG. 1) in accordance with an embodiment of the present invention. Memory cells 50 and 50A may be six transistor SRAM cells having cross-coupled inverters that transfer data and complemented data respectively from/to a global bit line 22 and a global bit # line 32, where the # symbol implies bit lines having complemented data. In particular, write circuits (usually located near the sense amps) write data on global bit line 22 that is buffered by buffer and pass-gate circuit 24 and provided on a local bit line 23 to memory cells 50A. Similarly, complemented data on global bit # line 32 is buffered by buffer and pass-gate circuit 34 and provided on a local bit # line 32 to memory cells 50A. The hierarchical bit line configuration reduces both the diffusion capacitance and wire capacitance during the reading and writing process of each SRAM memory cell. By limiting the size of the local bit lines, the number of cells attached to each of the local bit lines is reduced and the global bit line is exposed to the capacitive load of only one of these local bit lines at a time.

Buffer and pass-gate circuit 24 includes an inverter 26 and an N-channel pull-down device 28, with the input of inverter 26 connected to global bit line 22 and the output of device 28 connected to local bit line 23. A P-channel pass-gate transistor 30 has a gate to receive a signal PASS 1 and conductively couple the global bit line 22 to the local bit line 23. The signal PASS 1 is a select signal based on a decoding of addresses supplied to memory 16. Buffer and pass-gate circuit 34 also includes an inverter 36 and an N-channel pull-down device 38, with the input of inverter 36 connected to global bit line 32 and the output of device 38 connected to local bit line 33. A P-channel transistor 40 has a gate that also receives the signal PASS 1 and conductively couples global bit line 32 to the local bit line 33. P-channel transistors 30 and 40 allow a voltage potential near $V_{CC}$ to be passed from the global bit lines onto the local bit lines and provide a small signal swing for bit line operation during reads. Buffer and pass-gate circuits 24 and 34 provide a voltage potential near $V_{SS}$ when writing a zero logic level into a selected memory cell. Note that buffer and pass-gate circuits 24 and 34 are advantageous as they provide gain and may therefore be faster that alternative embodiments.

The group of memory cells 50A receive the signals $WORD_{SEL(0)}$, $WORD_{SEL(1)}$, ..., and $WORD_{SEL(N)}$ to select an individual row of memory cells for reading and writing, where N is an integer number and a power of two divisor of the total number of SRAM cells in a column of memory 16. In this embodiment, data on global bit line 22 and complemented data on global bit # line 32 is passed to respective buffer and pass-gate circuits 24 and 34, where the data on local bit line 23 and the complemented data on local bit # line 33 is provided locally to the group of N memory cells 50A.

The hierarchical bit line configuration evident in the columns of memory 16 provides global bit lines that couple data to corresponding local bit line segments connected to the SRAM memory cells. In other words, in a write operation the data from the sense amps is written onto global bit lines 22 and 32 and transferred through buffer and pass-gate circuits 24 and 34 to local bit lines 23 and 33 and stored in a memory cell 50A in the row selected by the appropriate $WORD_{SEL}$ signal. Note that during a write operation, the global bit lines are driven differentially.

In a read operation, the data from the memory cells in the row selected by the appropriate $WORD_{SEL}$ signal is placed on local bit lines 23 and 33 and transferred by the PASS 1 signal to the global bit lines 22 and 32 to be read by the sense amps. Note that during the read operation, only one pass signal (such as the PASS 1 signal) is conductive to provide isolation of the selected memory cells 50A from the diffusion capacitance found in other prior art memory designs.

FIG. 2 also illustrates an alternate embodiment that may use latches 25 and 35 instead of buffer and pass-gate circuits 24 and 34. It should be pointed out that a P-channel transistor (not shown) may be added in series with the P-channel transistors found in the second inverters of each latch to provide a half tri-state buffer that is beneficial for read operations that may remove any contention between the write driver and the SRAM device.

Figure 3:
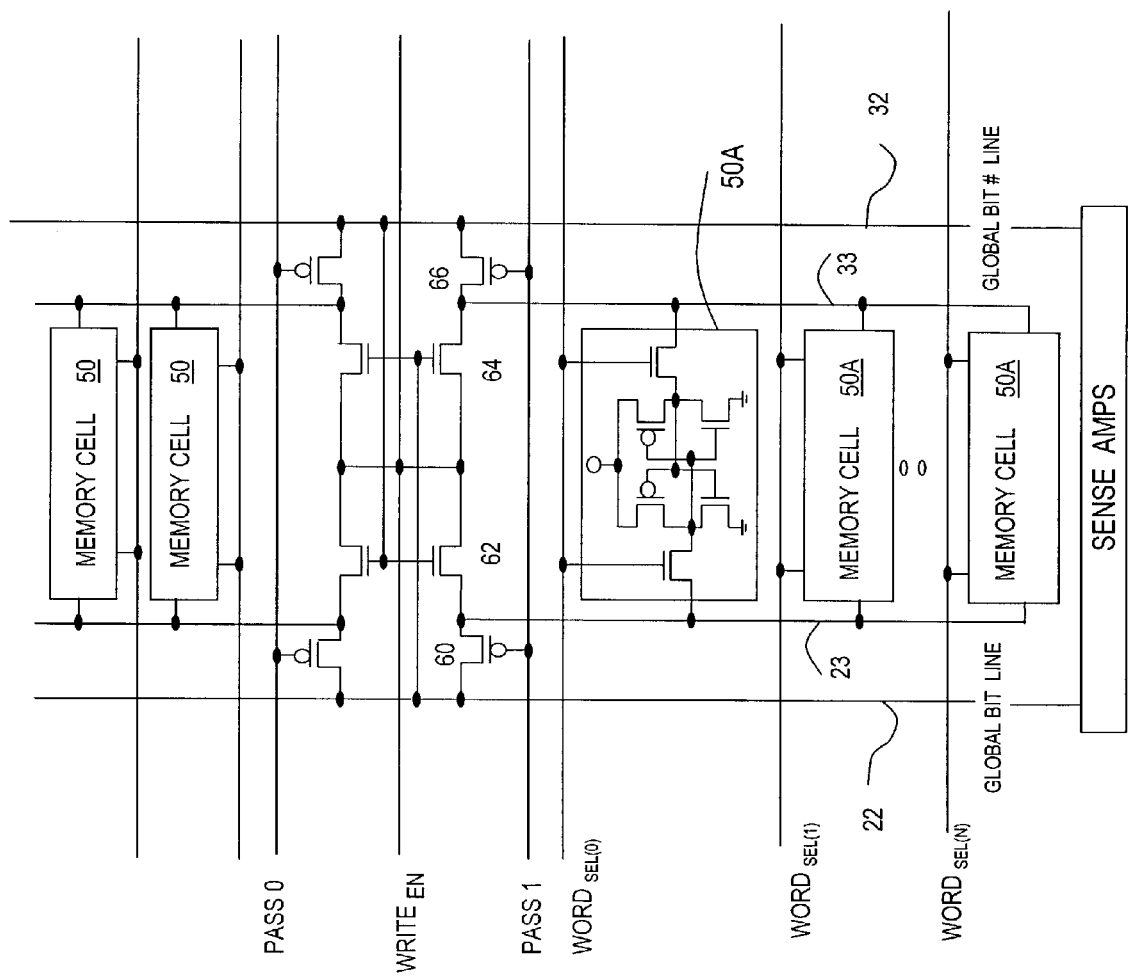
FIG. 3 is a diagram that illustrates another embodiment for writing and reading the memory of FIG. 1.

FIG. 3 illustrates another embodiment for a hierarchical bit line configuration having global bit lines connected to sense amps and corresponding local bit line segments connected to the SRAM memory cells. More specifically, global bit line 22 is connected to the sense amps and coupled to local bit line 23 through a P-channel transistor 60. Similarly, global bit # line 32 is connected to the sense amps and coupled through a P-channel transistor 66 to local bit # line 33. Transistors 60 and 66 have gates that receive the PASS 1 signal. With the PASS 1 signal active low, the sense amp connected to global bit line 22 may pass data through conductive transistor 60 to local bit # line 23 and the memory cells 50A. Further, global bit # line 32 may pass complemented data through conductive transistor 66 to local bit # line 33 and the same group of memory cells 50A.

Additionally, an N-channel transistor 62 has a gate coupled to global bit # line 32, one conductive terminal coupled to local bit line 23 and another conductive terminal coupled to receive a $WRITE_{EN}$ (write enable) signal. Another N-channel transistor 64 has a gate coupled to global bit line 22, one conductive terminal coupled to local bit # line 33 and another conductive terminal coupled to receive the $WRITE_{EN}$ signal. Note that transistors 62 and 64 are connected cross-coupled to take advantage of the differential signals on global bit line 22 and global bit # line 32. By way of example of a write operation that stores a zero in memory cell 50A, a near zero value supplied by a sense amp on global bit line 22 is transferred through transistor 60 to local bit line 23. The P-channel transistor does not provide a "perfect" zero value but drives local bit line 23 to a voltage above zero by Vtp, the threshold of the PMOS transistor, due to the inherent operation of the P-channel device. During the write operation, the $WRITE_{EN}$ signal has a ground potential that is passed through transistor 62, which is "on" by virtue of the differential signals on the global bit lines and transistors 62 and 64 being cross-coupled. It may be desirable to locally buffer the $WRITE_{EN}$ signal since that signal does drive current during the write operation. The ground potential passed through transistor 62 drives the local bit line 23 below the poor zero value (near ground+Vtp potential) that transistor 60 provides.

During a read operation, the $WRITE_{EN}$ signal has a value at or near $V_{CC}$, and with the source and drain terminals of transistors 62 and 64 also near $V_{CC}$ the transistors are essentially "off" or non-conductive. The data from a memory cell 50A is selected by the appropriate $WORD_{SEL}$ signal and read out onto local bit lines 23 and 33. The PASS 1 signal being active low transfers the data through transistors 60 and 66 to the global bit lines 22 and 32 where it can be read by the sense amp.

By now it should be clear that embodiments have been presented that improve system performance when a write circuit structure is used to transfer data between global bit lines and local bit lines of a cache. The hierarchical bit lines may be used effectively to improve the write access time for larger memory arrays, such as L2 type memories.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A memory comprising:
   a sense amp coupled to first and second global bit lines; and
   memory cells arrayed in a column and coupled to first and second local bit lines to receive data respectively supplied from the first global bit line through a first non-inverting buffer and the second global bit line through a second non-inverting buffer that includes an inverter having an input coupled to the second global bit line and a transistor having a gate coupled to an output of the inverter and having a current conduction terminal coupled to the second local bit line.

2. The memory of claim 1, further comprising a first transistor having conduction terminals coupled between the first global bit line and the first local bit line and a gate to receive an address and a second transistor having conduction terminals coupled between the second global bit line and the second local bit line and a gate to receive the address.

3. The memory of claim 1, wherein the first non-inverting buffer includes:
   an inverter having an input coupled to the first global bit line; and
   a transistor having a gate coupled to an output of the inverter and having a current conduction terminal coupled to the first local bit line.

4. A cache having memory cells, comprising:
   a sense amp coupled to first and second global bit lines; and
   first and second bit lines local to a group of the memory cells that couple the group of memory cells to the first and second global bit lines to make the memory cells readable and writeable to the sense amp; wherein data on the first global bit line is buffered by a first buffer and provided on the first local bit line to the group of memory cells and complemented data on the second global bit line is buffered by a second buffer and provided on the second local bit line to the group of memory cells.

5. The cache of claim 4, wherein the first buffer includes an inverter having an input coupled to the first global bit line and a transistor having a gate connected to an output of the inverter, a source connected to a ground reference, and a drain connected to the first local bit line and the second buffer includes an inverter having an input coupled to the second global bit line and a transistor having a gate connected to an output of the inverter, a source connected to the ground reference, and a drain connected to the second local bit line.

* * * * *